United States Patent
Nii et al.

(10) Patent No.: US 9,762,431 B2
(45) Date of Patent: Sep. 12, 2017

(54) COMMUNICATION DEVICE, ON-VEHICLE COMMUNICATION SYSTEM, AND INSPECTION METHOD

(71) Applicants: SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP); TOYOTA JIDOSHA KABUSHIKI KAISHA, Aichi (JP)

(72) Inventors: Kazuhiko Nii, Osaka (JP); Takeshi Hagihara, Osaka (JP); Nobuyuki Nakagawa, Aichi (JP)

(73) Assignees: SUMITOMO ELECTRIC INDUSTRIES, LTD., Osaka (JP); SUMITOMO WIRING SYSTEMS, LTD., Mie (JP); AUTONETWORKS TECHNOLOGIES, LTD., Mie (JP); TOYOTA JIDOSHA KABUSHIKI KAISHIA, Aichi (JP)

( * ) Notice: Subject to any disclaimer, the term of this patent is extended or adjusted under 35 U.S.C. 154(b) by 372 days.

(21) Appl. No.: 14/364,036

(22) PCT Filed: Dec. 6, 2012

(86) PCT No.: PCT/JP2012/081669
§ 371 (c)(1),
(2) Date: Jun. 9, 2014

(87) PCT Pub. No.: WO2013/084998
PCT Pub. Date: Jun. 13, 2013

(65) Prior Publication Data
US 2014/0355452 A1   Dec. 4, 2014

(30) Foreign Application Priority Data
Dec. 8, 2011 (JP) .................................. 2011-269393

(51) Int. Cl.
*G01R 31/02* (2006.01)
*H04L 12/24* (2006.01)
(Continued)

(52) U.S. Cl.
CPC ........ *H04L 41/0631* (2013.01); *B60R 16/023* (2013.01); *G02F 1/00* (2013.01);
(Continued)

(58) Field of Classification Search
CPC ....... H01L 21/00; H01L 2221/00; G02F 1/00; G02F 2201/00
See application file for complete search history.

(56) References Cited

U.S. PATENT DOCUMENTS 6,025,702 A * 2/2000 Launier .................... B60M 1/14
                                                      191/37
6,518,769 B1    2/2003 Ammon et al.
(Continued)

FOREIGN PATENT DOCUMENTS

CN         1307682 A      8/2001
CN       201472310 U      5/2010
(Continued)

OTHER PUBLICATIONS

Chinese Office Action issued in Chinese Application No. 201280060345.5 dated Sep. 6, 2015, with English translation.
(Continued)

*Primary Examiner* — Jermele M Hollington
*Assistant Examiner* — Temilade Rhodes-Vivour
(74) *Attorney, Agent, or Firm* — McDermott Will & Emery LLP

(57) ABSTRACT

A communication device includes a first resistance connected between a first reference potential and a midway point of one of a pair communication lines connected to a coil, a second resistance and a third resistance arranged in
(Continued)

series so as to be connected between a second reference potential different from the first reference potential and a midway point of the other one of the pair communication lines, and a switch configured to open or close a path between the first resistance and the first reference potential.

11 Claims, 7 Drawing Sheets

(51) Int. Cl.
      *B60R 16/023*    (2006.01)
      *H01L 21/00*     (2006.01)
      *G02F 1/00*      (2006.01)

(52) U.S. Cl.
     CPC .......... *G02F 2201/00* (2013.01); *H01L 21/00* (2013.01); *H01L 2221/00* (2013.01)

(56) References Cited

U.S. PATENT DOCUMENTS

| | | | |
|---|---|---|---|
| 2004/0100289 A1* | 5/2004 | Lull | G01F 1/6847 324/693 |
| 2004/0153223 A1 | 8/2004 | Fujita et al. | |
| 2006/0032316 A1* | 2/2006 | Ishikawa | G01F 1/60 73/861.11 |
| 2006/0214854 A1* | 9/2006 | Ukai | H04B 1/0466 343/700 MS |
| 2008/0252429 A1* | 10/2008 | Yanagida | H04B 3/548 340/12.32 |
| 2010/0007306 A1* | 1/2010 | Fukui | B60K 6/445 320/107 |
| 2010/0274451 A1* | 10/2010 | Hiruma | B60R 16/03 701/48 |

FOREIGN PATENT DOCUMENTS

| | | |
|---|---|---|
| JP | 62-169552 A | 7/1987 |
| JP | 2005-287277 A | 10/2005 |
| JP | 2007-072686 A | 3/2007 |

OTHER PUBLICATIONS

"Surface Vehicle Recommended Practice," J1772 Jan. 2010, Society of Automotive Engineers, Inc., Oct. 1996 (revised in Jan. 2010), pp. 1-51.

International Search Report issued in International Application No. PCT/JP2012/081669, mailed Feb. 12, 2013.

* cited by examiner

FIG. 7

| STATE OF COMMUNICATION LINE | | ADC CIRCUIT INPUT VOLTAGE VALUE |
|---|---|---|
| NORMAL | | R3 / (R1+R2+R3) × $V_{ref}$ |
| ABNORMAL | OPEN FAULT | 0 |
| | SUPPLY FAULT | R3 / (R2+R3) × $V_B$ |
| | GROUND FAULT | 0 |

COMMUNICATION DEVICE, ON-VEHICLE COMMUNICATION SYSTEM, AND INSPECTION METHOD

RELATED APPLICATIONS

This application is the U.S. National Phase under 35 U.S.C. §371 of International Application No. PCT/JP2012/081669, filed on Dec. 6, 2012, which in turn claims the benefit of Japanese Application No. 2011-269393, filed on Dec. 8, 2011, the disclosures of which are incorporated by reference herein.

BACKGROUND

1. Technical Field

The present application relates to a communication device provided with a pair of communication lines, an on-vehicle communication system including the communication device and an inspection method using the communication device.

2. Description of the Related Art

In recent years, electric vehicles and hybrid vehicles, each of which is equipped with devices such as a motor and a battery, and runs by driving the motor with electric power stored in the battery, have come to be widespread. An electric vehicle charges a battery by feeding power from an external power feeding device. Also for hybrid vehicles, a plug-in hybrid vehicle which enables its battery to be charged from an external power feeding device has been put in practical use. The external power feeding device corresponds to a power feeding device installed in facilities such as general houses and commercial power feeding stations. In feeding power from the power feeding device to a vehicle, a plug at the tip end of a charge cable connected to the power feeding device becomes connected to a feed port provided at a vehicle as a power receiving connector. Power is then fed from the power feeding device to the vehicle through a feed line enclosed in the charge cable to charge a battery.

It is noted that the charge cable also encloses wiring other than the feed line, e.g., a ground line and a control line. The control line is wiring used to transmit control signals such as a control pilot signal used for feed control of an electric storage device. By transmitting and receiving control signals between a power feeding device and a vehicle through the control line, various states, such as the connection state of a charge cable, the state of a battery as to whether it is chargeable and the state of charging, may be detected so as to perform charge control in accordance with the detected state.

Furthermore, when a vehicle required to be externally supplied with power such as an electric vehicle or a hybrid vehicle is put to practical use, it is necessary to have a communication function for transmitting and receiving information for charge control as well as communication information for managing the amount of charged power, the billing or the like.

Thus, standardization of communication such as power line communication has been in progress, in which communication is performed between a vehicle and a power feeding device by superimposing communication signals using a feed line as a medium. As for a method of transmitting and receiving communication signals, standardization has also been in progress not only for power line communication but also for other types of communication such as in-band communication for transmitting and receiving signals between a vehicle and a power feeding device by superimposing communication signals onto control signals using a control line as a medium (see SURFACE VEHICLE RECOMMENDED PRACTICE, J1772, October 1996 (Revised in January 2010), Society of Automotive Engineers, Inc., for example).

In communication such as power line communication and in-band communication, a superimposition/separation unit using a transformer provided with a primary coil and a secondary coil for wiring such as a feed line, a ground line and a control line. The superimposition/separation unit superimposes and separates communication signals input/output from a communication device connected through a communication line onto/from wiring so as to perform communication between a vehicle and a power feeding device.

PRIOR ART

Non-Patent Literature

However, abnormality may occur in a communication line in a communication device, such as open fault, supply fault and ground fault, which may have various problems in detection thereof. For example, it is necessary to perform fault diagnosis in the case of the open fault such as disconnection of a communication line, which also requires to assume the possibility of another abnormality occurring somewhere other than the communication line, resulting in cumbersome work.

Moreover, in the case of the supply fault where a communication line is short-circuited to a power supply voltage and the ground fault where a communication line is short-circuited to a ground potential, the communication itself is still possible even after such fault occurs. The user may therefore leave the fault without noticing it.

SUMMARY

The present application has been devised in view of the circumstances described above. An object of the application is to provide a communication device, an on-vehicle communication system and an inspection method that facilitate inspection and detection of occurrence of abnormality by connecting a communication line to the first reference potential and the second reference potential through a resistance.

The communication device according to the present application is characterized by including a first resistance connected to a first reference potential from a midway point of one of a pair of communication lines connected to a coil, a second resistance and a third resistance arranged in series so as to be connected to a second reference potential different from the first reference potential from a midway point of the other one of the pair of communication lines, and a switch opening and closing between the first resistance and the first reference potential.

The communication device according to the present invention is characterized by including a detection means for detecting a potential between the second resistance and the third resistance when the switch is closed, and an inspection means for inspecting abnormality based on the potential detected by the detection means, the first reference potential and the second reference potential, as well as resistance values of the first resistance, the second resistance and the third resistance.

The communication device according to the present application is characterized by including a fourth resistance connected to the second reference potential from a point between the first resistance and the switch.

The communication device according to the present application is characterized by including a sum of resistance values of the first resistance and the fourth resistance is approximately equal to a sum of resistance values of the second resistance and the third resistance.

The communication device according to the present application is characterized by including a terminal resistance connected to the pair of communication lines, wherein a sum of resistance values of the first resistance, the second resistance, the third resistance and the fourth resistance is larger than a resistance value of the terminal resistance.

The on-vehicle communication system according to the present invention is the on-vehicle communication system performing communication with a device inside and outside a vehicle through in-vehicle wiring used to feed power to an electric storage device mounted on the vehicle, characterized by including the communication device according to the present invention, performing input/output of a communication signal concerning communication, and a superimposition/separation unit superimposing/separating a communication signal trough the in-vehicle wiring, wherein the superimposition/separation unit includes a primary coil connected to the in-vehicle wiring, and a secondary coil electromagnetically coupled to the primary coil, and wherein the coil to which the pair of communication lines are connected is the secondary coil included in the superimposition/separation unit.

The inspection method according to the present application is the inspection method for inspecting abnormality in a pair of communication lines connectable to a coil, for a communication device provided with the communication lines, characterized in that the communication device executes the steps of closing the switch, detecting a potential between the second resistance and the third resistance when the switch is closed, inspecting abnormality based on the detected potential, the reference potentials, and resistance values of the first resistance, the second resistance and the third resistance, and recording and/or outputting a result of inspection.

In the present application, the voltage of a reference potential is divided to the respective resistances in accordance with the situation of abnormality.

In the present application, abnormality can be inspected based on the potential between the second resistance and the third resistance.

In the present application, the reference values from the second reference potential with respect to a pair of communication lines may be set to be approximately equal to each other.

In the present application, the resistance values of the first, second, third and fourth resistances are adjusted to prevent communication signals from leaking to the sides of the resistances.

In the communication device, on-vehicle communication system and inspection method according to the present application, the voltage of the reference potential divided to each resistance is changed, since the connection state of the circuit changes in accordance with the state of abnormality. Thus, abnormality such as an open fault, a supply fault or a ground fault may be detected based on the potential between the second resistance and the third resistance to facilitate the inspection and detection of abnormality, providing beneficial effects.

Moreover, in the present application, the resistance values from the second reference potential to a pair of communication lines may be set to be approximately equal to each other, so that an adverse effect on communication can be eliminated even when a circuit related to the present application is added, providing beneficial effects.

Furthermore, in the present application, the sum of the resistance values of the first, second, third and fourth resistances is set larger than the terminal resistance, so as to prevent communication signals from leaking to the side of the first to fourth resistances, providing beneficial effects.

BRIEF DESCRIPTION OF THE SEVERAL VIEWS OF THE DRAWINGS

FIG. 7 is a table illustrating a determination example of an abnormal state of the communication device included in the on-vehicle communication system according to the present application.

DETAILED DESCRIPTION

The present application will be described below with reference to the drawings illustrating the embodiments thereof.

Figure 1:
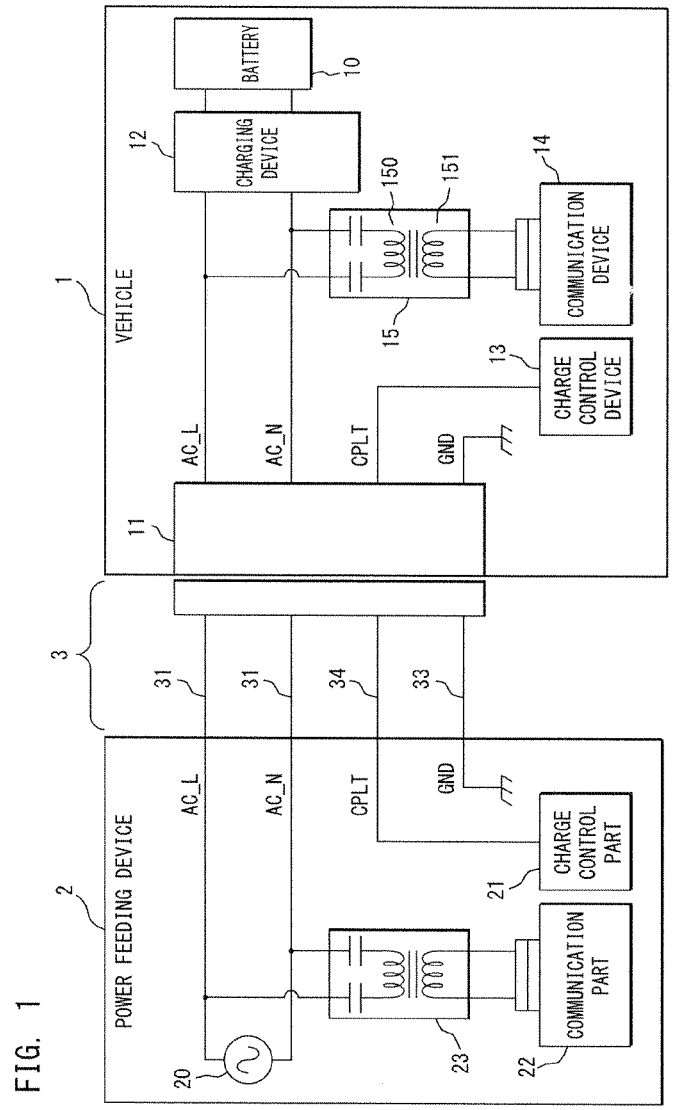
FIG. 1 is an explanatory view illustrating a configuration example of an on-vehicle communication system according to the present application.

FIG. 1 is an explanatory view illustrating a configuration example of an on-vehicle communication system according to the present application. FIG. 1 shows an example where the present application is applied to the case where power is supplied from a power feeding device 2 such as a charging stand to a battery (a storage) 10 included in a vehicle 1 such as an electric vehicle and a plug-in hybrid vehicle.

The vehicle 1 and the power feeding device 2 may be connected with each other through a charge cable 3. The charge cable 3 encloses therein two feed lines 31 and 32 used as power supply lines, a ground line 33 which is conductive wire for grounding, and a control line 34 transmitting control signals such as a control pilot signal (CPLT) used for charge control. One end of the charge cable 3 is connected to the power feeding device 2 side, while the other end thereof may be connected to a receiving connector 11 disposed as an on-vehicle feed port on the vehicle 1 side. By connecting the other end of the charge cable 3 to the receiving connector 11, the circuit configuration illustrated in FIG. 1 may be attained.

The feed lines 31 and 32 are AC lines to which alternating voltage is applied. The control line 34 is a signal line transmitting and receiving control signals such as a control pilot signal. The feed lines 31 and 32 may also be used as media for transmitting management information such as vehicle authentication, charging management and billing management as well as various other information. In other words, the vehicle 1 is able to communicate with the power feeding device 2 by superimposing and separating communication signals onto/from the feed lines 31 and 32.

The power feeding device 2 includes a power supply part 20 supplying alternating power, a charge control part 21 performing communication concerning charge control, a communication part 22 performing input/output of communication signals, and a superimposition/separation part 23 superimposing and separating communication signals, which are input and output to/from the communication part 22, onto/from the feed lines 31 and 32.

The power supply part 20 is connected to one end of each of the feed lines 31 and 32. The charge control part 21 is connected to one end of the control line 34. The wiring in the power feeding device 2 corresponds to internal conductive wire serving as extended lines connected to the feed lines 31, 32, ground line 33 and control line 34 enclosed in the charge cable 3 outside the power feeding device 2. In the description below, however, the part of the extended lines disposed as the internal conductive wire will also be described as feed lines 31, 32, ground line 33 and control line 34 for convenience.

The charge control part 21 is, for example, a circuit on the output side which conforms to the International Standard related to charge control, and performs charge control in various states, such as confirmation of connection and start of energization, by transmitting and receiving control signals such as a control pilot signal.

The superimposition/separation part 23 is connected to branch lines branched from the feed lines 31 and 32, and is configured with a circuit such as a capacitor or a coupling transformer (circuit such as a signal transformer of the electromagnetic induction type), which is connected to the branch lines. The superimposition/separation part 23 superimposes various communication signals output from the communication part 22 onto the feed lines 31 and 32, and inputs various communication signals separated from the feed lines 31 and 32, so as to perform power line communication using the feed lines 31 and 32 as media.

The capacitor has high impedance for alternating-current (AC) power supplied through the feed lines 31 and 32, whereas it has low impedance for communication signals using a band for low-speed communication of several tens to several hundreds of kHz or a band for high-speed communication of several MHz to several tens of MHz. In other words, the capacitor passes the signals in the frequency band used for communication signals while blocking off the signals in the frequency band used for AC power in the transmission path branched from the feed lines 31 and 32.

The vehicle 1 includes, in addition to the battery 10 and the receiving connector 11, a charging device 12 for charging the battery 10, a charge control device 13 performing communication concerning charge control, a communication device 14 performing transmission and reception of communication signals, and a superimposition/separation unit 15 performing superimposition and separation of communication signals onto/from the pair of feed lines 31 and 32.

In the vehicle 1, in-vehicle wiring is disposed which is connected to the feed lines 31, 32, ground line 33 and control line 34. The in-vehicle wiring connected to the feed lines 31 and 32 are AC lines connected to the charging device 12, which charges the battery 10. The in-vehicle wiring connected to the ground line 33 is body-earthed. The in-vehicle wiring connected to the control line 34 is connected to the charge control device 13 through an extended line. In the description below, each in-vehicle wiring, AC lines and extended lines are also described as the feed lines 31, 32, ground line 33 and control line 34 for convenience, unless they need to be specifically identified.

The superimposition/separation unit 15 is connected to a pair of branch lines branched from the in-vehicle wiring connected to the feed lines 31 and 32.

The charge control device 13 is, for example, a circuit on the input side which conforms to the International Standard related to charge control, and performs charge control in various states, such as confirmation of connection and start of communication, by transmitting and receiving control signals such as a control pilot signal.

The communication device 14 includes a function for transmitting and receiving various communication signals to/from the power feeding device 2, and is connected to the superimposition/separation unit 15 through a pair of communication lines.

The superimposition/separation unit 15 is a circuit such as a coupling transformer (signal transformer of the electromagnetic induction type) provided with a primary coil 150, both ends of which are connected to the feed lines 31 and 32 through a capacitor, and a secondary coil 151 electromagnetically coupled to the primary coil 150. It is noted that both ends of the secondary coil 151 are connected to a pair of communication lines in the communication device 14.

The capacitor has high impedance for AC power supplied through the feed lines 31 and 32, whereas it has low impedance for communication signals using a band for low-speed communication of several tens to several hundreds of kHz or a band for high-speed communication of several MHz to several tens of MHz. In other words, the capacitor passes the signals in the frequency band used for communication signals while blocking off the signals in the frequency band used for AC power in the transmission path branched from the feed lines 31 and 32.

The superimposition/separation unit 15 superimposes various communication signals onto the feed lines 31 and 32, and separates the superimposed various communication signals. The superimposition/separation unit 15 superimposes various communication signals output from the communication device 14 onto the feed lines 31 and 32, and inputs various communication signals separated from the feed lines 31 and 32, so as to perform power line communication using the feed lines 31 and 32 as media.

In the example illustrated in FIG. 1, a loop circuit is formed in which communication signals are transmitted by the superimposition/separation circuit 15, feed lines 31, 32, superimposition/separation part 23 as well as other wiring, elements and circuits. This allows power line communication which superimposes communication signals onto the feed lines 31 and 32 to be implemented between the communication device 14 in the vehicle 1 and the communication part 22 in the power feeding device 2.

Figure 2:
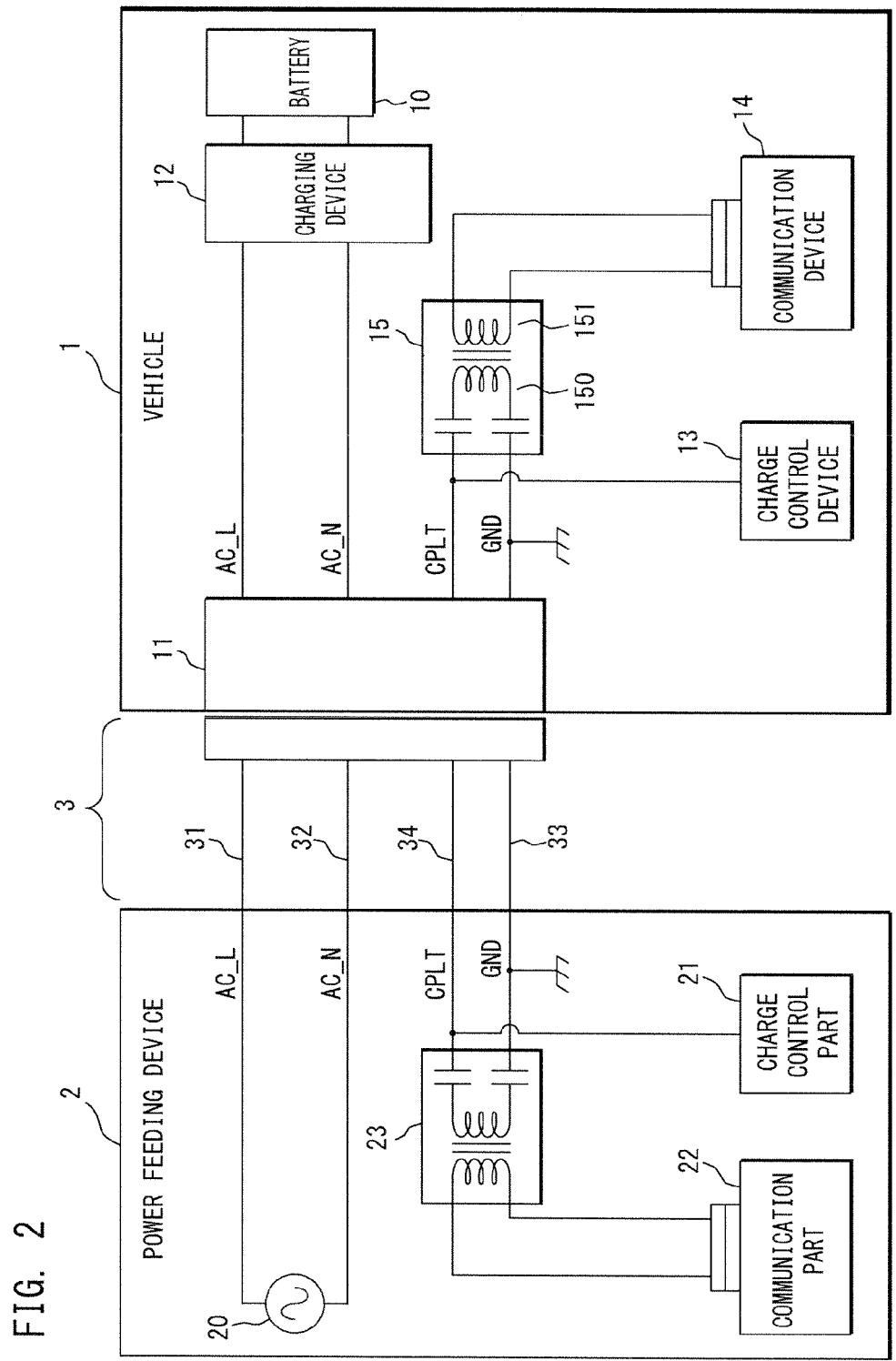
FIG. 2 is an explanatory view illustrating a configuration example of an on-vehicle communication system according to the present application.

FIG. 2 is an explanatory view illustrating a configuration example of an on-vehicle communication system according to the present application. FIG. 2 illustrates another form different from the example shown in FIG. 1, and illustrates an example where the present example is applied to in-band communication. It is noted that configuration parts similar to those shown in FIG. 1 are denoted by the same reference codes and will not be described in detail, while reference is to be made to the description of the similar parts.

In the example shown in FIG. 2, a superimposition/separation part 23 included in the power feeding device 2 is connected to branch lines branched from the ground line 33 and control line 34. The superimposition/separation part 23 superimposes various communication signals output from the communication part 22 onto the ground line 33 and control line 34, and inputs various communication signals separated from the ground line 33 and control line 34, so as to perform in-band communication using the ground line 33 and control line 34 as media.

The superimposition/separation unit 15 included in the vehicle 1 is connected to branch lines branched from the ground line 33 and control line 34. The superimposition/separation unit 15 is a circuit such as a coupling transformer provided with a primary coil 150, both ends of which are connected to the ground line 33 and control line 34, and a secondary coil 151 electromagnetically coupled to the primary coil 150. It is noted that both ends of the secondary coil 151 are connected to a pair of communication lines in the communication device 14.

The superimposition/separation unit 15 superimposes various communication signals onto the ground line 33 and control line 34, and separates the superimposed various communication signals therefrom. The superimposition/separation unit 15 superimposes various communication signals output from the communication device 14 onto the ground line 33 and control line 34, and inputs various communication signals separated from the ground line 33 and control line 34 to the communication device 14, so as to perform in-band communication using the ground line 33 and control line 34 as media.

In the example illustrated in FIG. 2, a loop circuit is formed in which communication signals are transmitted by the superimposition/separation circuit 15, ground line 33, control line 34, superimposition/separation part 23 as well as other wiring, elements and circuits. This allows in-band communication which superimposes communication signals onto the ground line 33 and control line 34 to be implemented between the communication device 14 in the vehicle 1 and the communication part 22 in the power feeding device 2.

Figure 3:
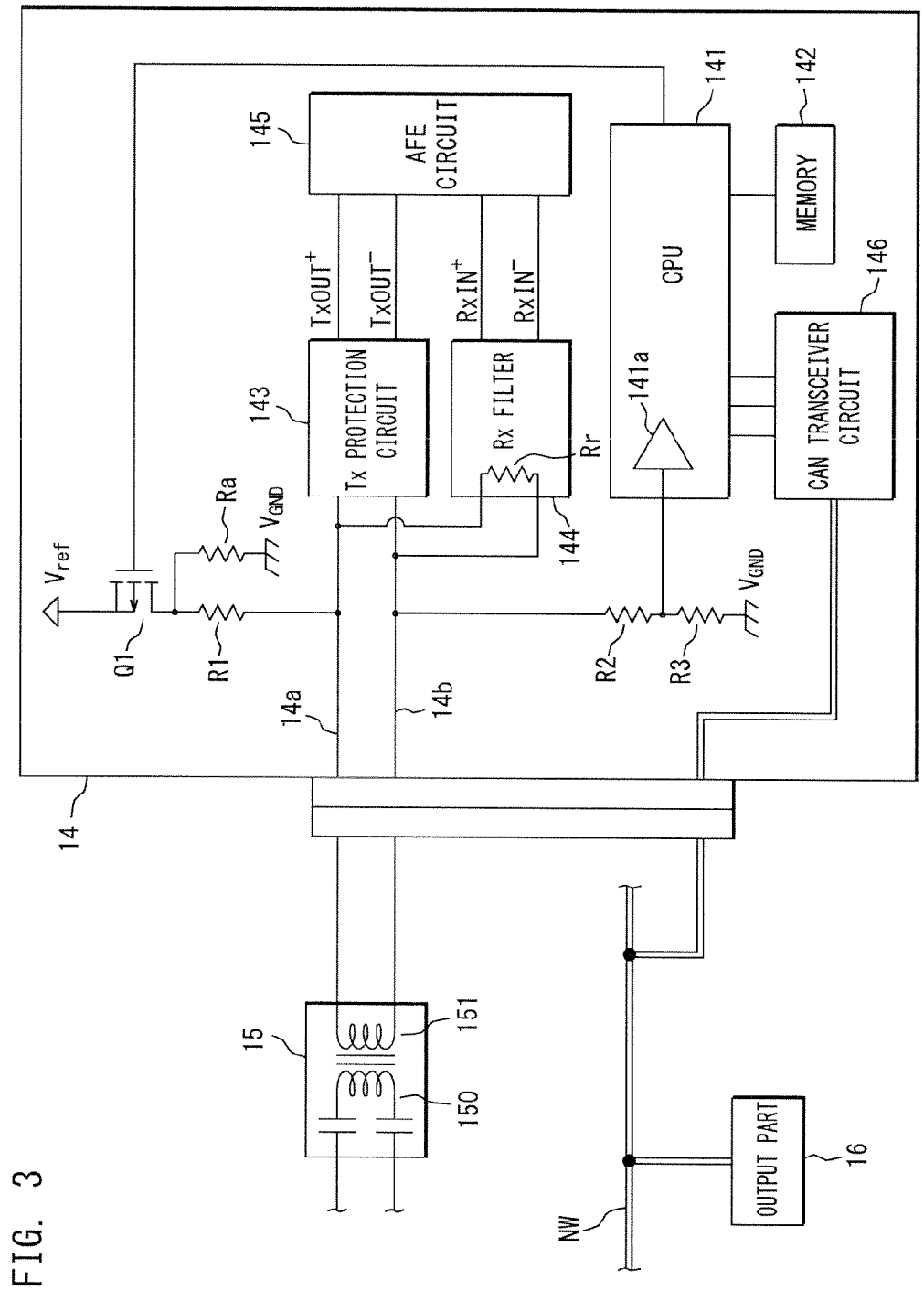
FIG. 3 is a block diagram illustrating a configuration example of a communication device included in the on-vehicle communication system according to the present application.

FIG. 3 is a block diagram illustrating a configuration example of the communication device 14 included in the on-vehicle communication system according to the present application. The communication device 14 includes a CPU (Central Processing Unit) 141 as a control part controlling the entire device, while a memory 142 is connected to the CPU 141 as a storage part storing various kinds of information used in execution of processing performed by the CPU 141.

Moreover, the communication device 14 includes a pair of OFDM (Orthogonal Frequency Division Multiplexing) lines connected to both ends of the secondary coil 151 of the superimposition/separation unit 15, and a pair of internal writing connected to the OFDM lines. The internal wiring is connected to a Tx protection circuit 143 functioning as a transmission part outputting various signals such as communication signals and to an Rx filter 144 functioning as a reception part to which various signals are input. The Rx filter 144 is provided with a terminal resistance Rr connected to the pair of internal wiring. Furthermore, an AFE (Analog Front End) circuit 145 is disposed in the Tx protection circuit 143 and Rx filter 144, to perform A/D conversion of communication signals. In the description below, the pair of OFDM lines and internal wiring are also indicated as a pair of communication lines 14a and 14b.

Furthermore, the communication device 14 includes a CAN (Controller Area Network) transceiver circuit 146 connected to an in-vehicle communication network NW such as a CAN bus based on the communication standard like CAN disposed in the vehicle 1. The communication device 14 is able to communicate with an output part 16 such as various ECUs disposed in the vehicle 1 through the in-vehicle communication network NW, and makes the output part 16 output, for example, the display of cautions, lighting of various LEDs and ringing of alarming sound.

The first branch line is connected to the midway of one communication line 14a among the pair of communication lines 14a and 14b, and is connected to the first reference potential through the first resistance R1 and switch element Q1 connected in series. The switch element Q1 is a semiconductor switch such as a MOSFET and a bipolar transistor, and is opened and closed upon control by the CPU 141. It is assumed here that a reference voltage $V_{ref}$ which is equal to or less than a power supply voltage $V_{+B}$ is set as the first reference potential ($V_{ref} \leq V_{+B}$). The CPU 141 closes the switch element Q1 and applies the reference voltage $V_{ref}$ when inspection is performed for abnormality concerning the communication lines 14a and 14b.

Furthermore, the fourth resistance Ra is connected between the first resistance R1 and the switch element Q1 as a pull-down resistance connected to the second reference potential. The second reference potential is a potential different from the first reference potential. It is assumed here that a ground voltage $V_{GND}$ is set as the second reference potential. It is also possible to appropriately apply a bias voltage as the second reference potential, not limited to the ground voltage $V_{GND}$. Though the example where open/close switch for connecting and disconnecting the circuit is used as the switch element Q1 here, another switch may also be used, which is normally connected to the fourth resistance R and which comes to be connected to the reference voltage $V_{ref}$ at the abnormality inspection.

Moreover, in the midway of the other communication line 14b, the second branch line different from the first branch line is connected. The second branch line is connected to the second reference potential through the second resistance R2 and the third resistance R3 connected in series.

It is noted that the CPU 141 includes an ADC (Analog to Digital Converter) 141a as a detection means for detecting the potential between the second resistance R2 and the third resistance R3. When the switch element Q1 is closed for abnormality inspection, the potential between the second resistance R2 and the third resistance R3 is detected.

Description is now made for the resistance value of each resistance. It is preferable to set the sum (R1+Ra) of the resistance value (R1) of the first resistance R1 and the resistance value (Ra) of the fourth resistance Ra disposed in series between one communication line 14a and the ground voltage to be approximately equal to the sum (R2+R3) of the resistance value (R2) of the second resistance R2 and the resistance value (R3) of the third resistance R3 disposed in series between the other communication line 14b and the ground voltage. For example, the values are preferably set to satisfy the equation R1+Ra=R2+R3≥1 kΩ. This can eliminate the adverse effect on transmission using communication lines 14a and 14b as media, i.e. transmission of high-frequency communication signals, due to disruption of balance between electric elements such as the potential between the pair of communication lines 14a and 14b as well as the resistance values.

Furthermore, the sum of the respective resistance values of the first resistance R1, second resistance R2, third resistance R3 and fourth resistance Ra (R1+R2+R3+Ra) is preferably set as larger than the resistance value (Rr) of the terminal resistance Rr of the Rx filter 144. It is preferable to employ the multiplying rate of 50-100 times, for example, R1+R2+R3+Ra=20 kΩ if Rr=100-200Ω, or an even higher multiplying rate. By making the sum of the resistance values of the first resistance, second resistance, third resistance and fourth resistance (R1+R2+R3+Ra) larger than the resistance value (Rx) of the terminal resistance, it is possible to prevent communication signals from leaking to the first to fourth resistance side. This effect will be significant by further making the multiplying rate larger.

Though, in FIG. 2 described earlier, the configuration having the superimposition/separation unit 15 and superimposition/separation part 23 outside the communication device 14 in the vehicle 1 and outside the communication part 22 in the power feeding device 2, respectively, another configuration including the superimposition/separation unit 15 and the superimposition/separation part 23 inside the communication device 14 and the communication part 22, respectively, may also be employed. As a modification of the form illustrated in FIG. 2, the configuration including the superimposition/separation unit 15 and the superimposition/separation part 23 are included inside the communication device 14 and the communication part 22, respectively, will be described below.

Figure 4:
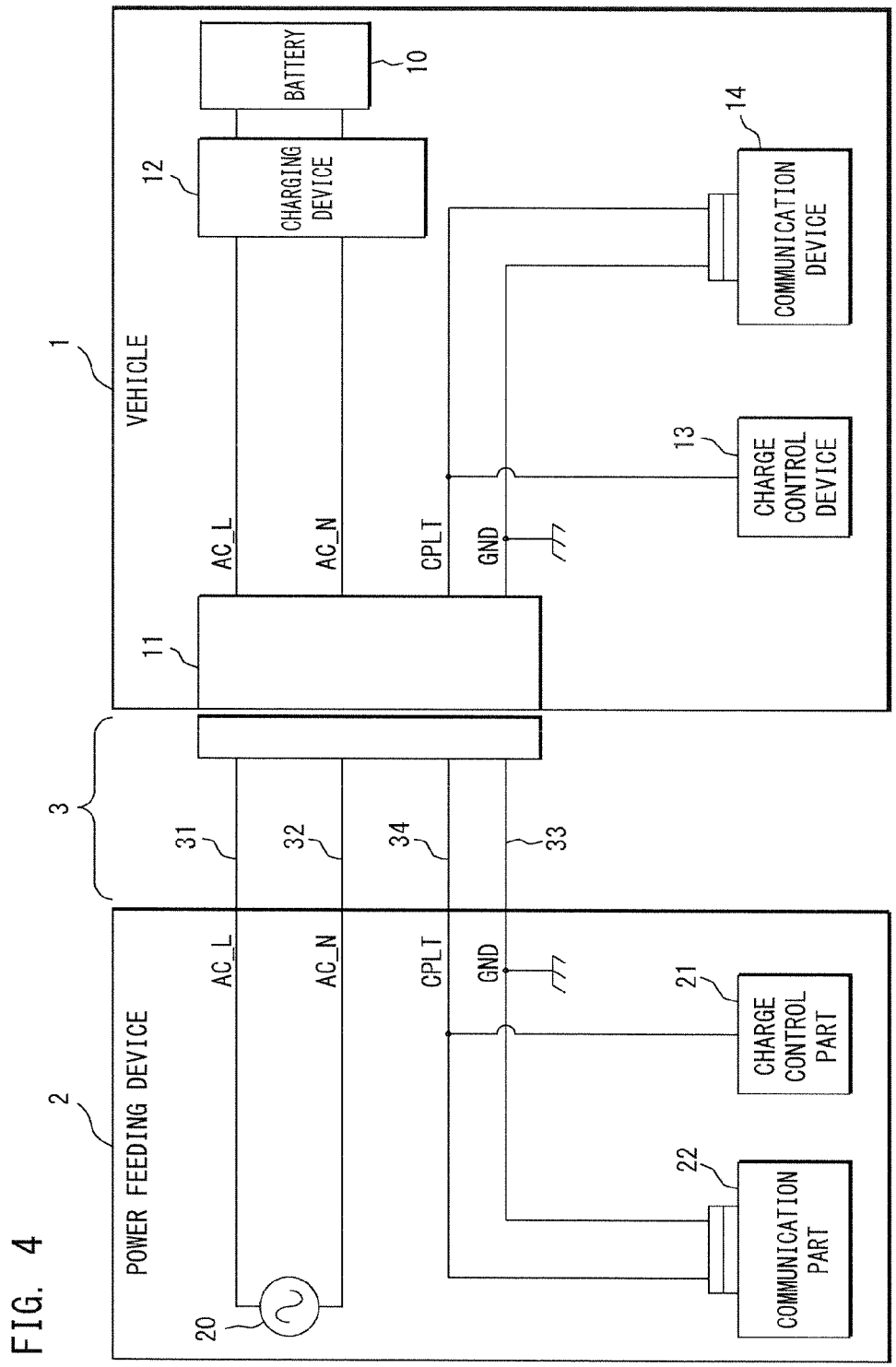
FIG. 4 is an explanatory view illustrating a modification of the on-vehicle communication system shown in FIG. 2.

FIG. 4 is an explanatory view illustrating a modification of the on-vehicle communication system shown in FIG. 2. Note that the configuration parts similar to those shown in FIG. 2 are denoted by the same reference codes and will not be described in detail.

According to the modification illustrated in FIG. 4, inside the communication device 14 and communication part 22, superimposition of various communication signals and separation of the superimposed various communication signals are performed onto/from the ground line 33 and control line 34. Thus, the vehicle 1 includes the superimposition/separation unit 15 inside the communication device 14 (see FIG. 5) while the power feeding device 2 includes the superimposition/separation part 23 inside the communication part 22.

The configuration realizes in-band communication, in which communication signals are superimposed onto the ground line 33 and control line 34, between the communication device 14 in the vehicle 1 and the communication part 22 in the power feeding device 2.

Figure 5:
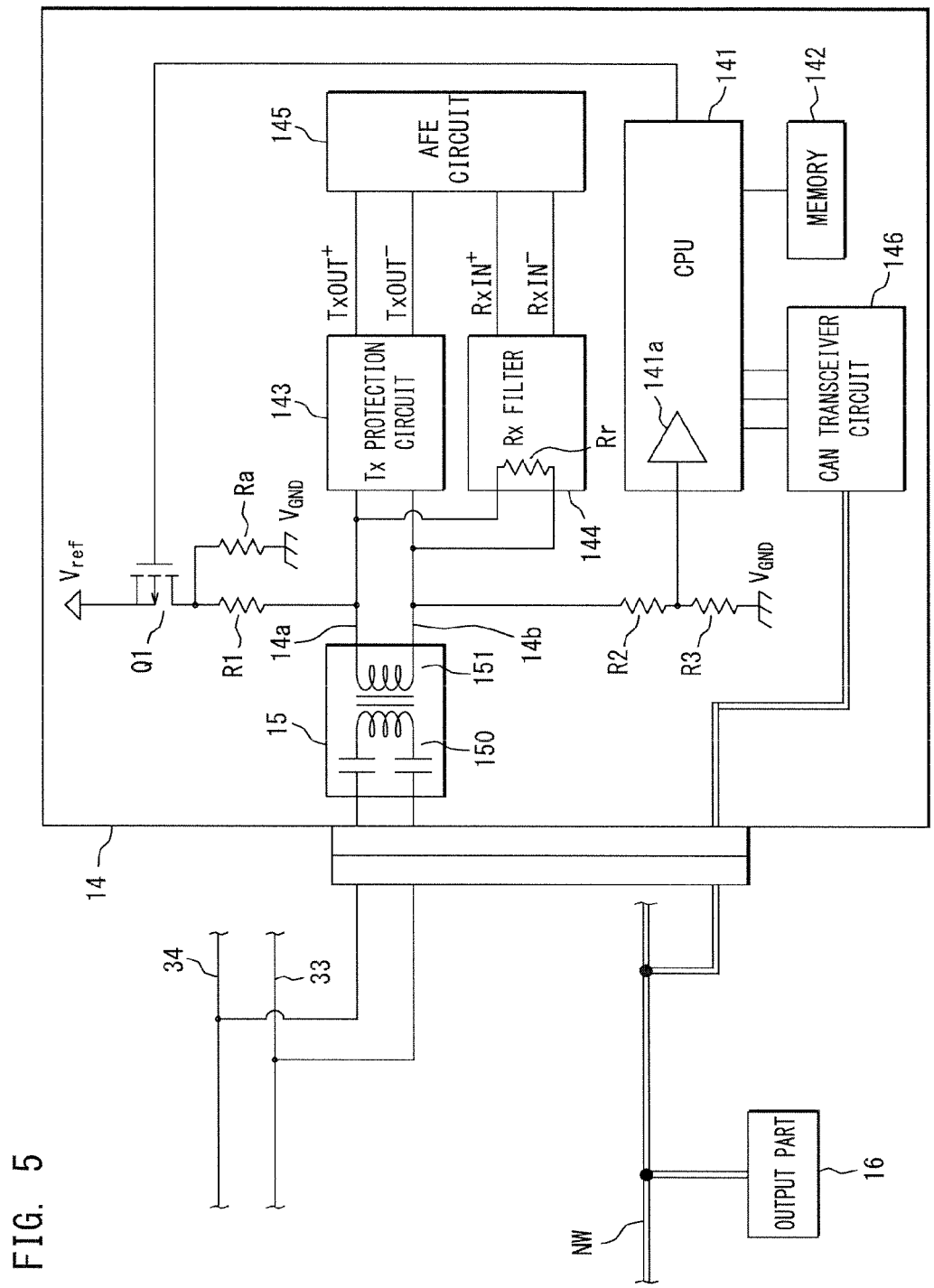
FIG. 5 is a block diagram illustrating a configuration example of the communication device in the on-vehicle communication system shown in FIG. 4.

FIG. 5 is a block diagram illustrating a configuration example of the communication device 14 in the on-vehicle communication system in FIG. 4. It is noted that each of the configuration parts shown in FIG. 5 has a function similar to that shown in FIG. 3, and the configuration parts similar to those in FIG. 3 will be described with the same reference codes.

The communication device 14 includes a CPU 141 as a control part controlling the entire device, and a memory 142 is connected to the CPU 141 as a storage part storing various information using execution of the processing performed by the CPU 141. Furthermore, the communication device 14 includes a CAN transceiver circuit 146 connected to the in-vehicle communication network NW such as a CAN bus based on the communication standard such as the CAN disposed in the vehicle 1.

One of the characteristics of the configuration example shown in FIG. 5 is that the superimposition/separation unit 15 is included inside the communication device 14. The superimposition/separation unit 15 is a circuit such as a coupling transformer provided with a primary coil 150, both ends of which are connected to the ground line 33 and control line 34, and a secondary coil 151 electromagnetically coupled to the primary coil 150. The both ends of the secondary coil 151 of the superimposition/separation unit 15 are connected to a pair of communication lines 14a and 14b inside the communication device 14.

The pair of communication lines 14a and 14b that are internal wiring of the communication device 14 are respectively connected to a Tx protection circuit 143 functioning as a transmission part outputting various signals such as communication signals and to an Rx filter 144 functioning as a reception part to which various signals are input. The Rx filter 144 is provided with a terminal resistance Rr to which the pair of communication lines 14a and 14b are connected. Furthermore, in the Tx protection circuit 143 and Rx filter 144, an AFE circuit 145 is disposed to perform A/D conversion of communication signals.

The first branch line is connected to the midway of one communication line 14a among the pair of communication lines 14a and 14b, the first branch line being connected to the first reference potential (reference potential $V_{ref}$) through the first resistance R1 and switching element Q1 connected in series. Moreover, the fourth resistance Ra is connected between the first resistance R1 and the switching element Q1 as a pull-down resistance connected to the second reference potential.

The second branch line different from the first branch line is connected to the midway of the other communication line 14b, the second branch line being connected to the second reference potential (ground voltage $V_{GND}$ or an appropriate bias voltage) through the second resistance R2 and the third resistance R3 connected in series.

The resistance value of each resistance shown in FIG. 5 is set to be, for example, similar to the resistance value shown in FIG. 3. The configuration eliminates the adverse effect on the communication using the communication lines 14a and 14b as media, i.e. transmission of high-frequency communication signals, due to disruption in balance between electrical elements such as the potential between the pair of communication lines 14a and 14b as well as the resistance values.

The configuration in FIG. 2 has the superimposition/separation unit 15 and superimposition/separation part 23 outside the communication device 14 in the vehicle 1 and outside the communication part 22 in the power feeding device 2, respectively, while the configuration in FIG. 4 has the superimposition/separation unit 15 and superimposition/separation part 23 inside the communication device 14 and the communication part 22, respectively. It is, however, possible to appropriately combine these configurations. For example, the superimposition/separation unit 15 may be located inside the communication device 14 whereas the superimposition/separation part 23 may be located outside the communication part 22. Moreover, the superimposition/separation unit 15 may also be located outside the communication device 14 whereas the superimposition/separation part 23 may be located inside the communication part 22. Furthermore, when the superimposition/separation unit 15 is located outside the communication device 14, a part or the whole of the superimposition/separation unit 15 may be integrated with the receiving connector 11.

Furthermore, though FIG. 4 illustrated the configuration in which the communication device 14 internally including the superimposition/separation unit 15 and the communication part 22 internally including the superimposition/separation part 23 are connected to the ground line 33 and the control line 34, respectively, it is also possible, as a modification of the on-vehicle communication system illustrated in FIG. 1, to connect one or both of the communication device 14 internally having the superimposition/separation unit 15 and the communication part 22 internally having the superimposition/separation part 23 to the feed lines 31 and 32.

It is noted that, in the on-vehicle communication system of the in-band communication illustrated in FIGS. 2 and 4, the configuration in which an LPF (Low Pass Filter) is mounted to prevent reading error of charge control signals and degrading in communication quality. Such an LPF can be inserted into one or both of the ground line 33 and control line 34. For example, it can be inserted between the branch part where the control line 34 is branched to the charge control part 21 and the charge control part 21, or between the branch part where the control line 34 is branched to the charge control device 13 and the charge control device 13. Moreover, the LPF may be included inside the charge control part 21 and the charge control device 13, or may be included inside the communication part 22 and the communication device 14. Furthermore, the receiving connector 11 may integrally be formed with the LPF.

Figure 6:
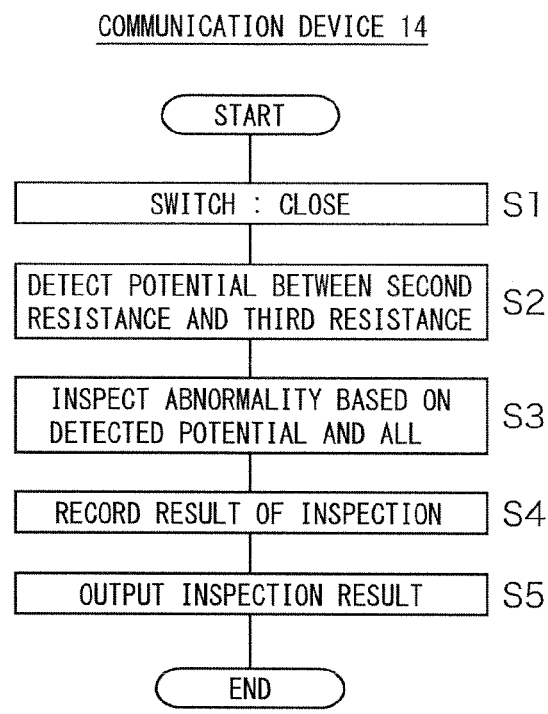
FIG. 6 is a flowchart illustrating an example of processing of abnormality inspection for the communication device included in the on-vehicle communication system according to the present application.

Next, processing of abnormality inspection for the communication device 14 is described. FIG. 6 is a flowchart illustrating an example of processing of abnormality inspection for the communication device 14 included in the on-vehicle communication system according to the present application. The processing of abnormality inspection is the processing of inspecting whether or not abnormality such as open fault, supply fault or ground fault occurs in the communication lines 14a and 14b. The communication device 14 starts the processing of abnormality inspection by using, as a trigger, a predetermined timing such as when the first transition is made from the idling period before communication such as power line communication or in-band communication is started to the communication processing, or when a human-induced operation concerning the abnormality inspection is accepted.

The CPU 141 in the communication device 14 closes the switch element Q1 as the processing of abnormality inspection (step S1). By step S1, one communication line 14a is connected to the reference voltage $V_{ref}$ through the first resistance R1.

The CPU 141 detects the potential between the second resistance R2 and the third resistance R3 at the ADC circuit 141a while the switch element Q1 is closed (step S2).

The CPU 141 inspects abnormality based on the detected potential, power supply voltage $V_{+B}$, reference voltage $V_{ref}$, ground voltage $V_{GND}$ as well as the resistance values (R1, R2, R3) of the first resistance R1, second resistance R2 and third resistance R3 (step S3). At step S3, the power supply voltage $V_{+B}$, reference voltage $V_{ref}$, ground voltage $V_{GND}$ as well as the resistance values (R1, R2, R3) of the first resistance R1, second resistance R2 and third resistance R3 may be used for inspection by reading information pre-stored in the memory 142.

The CPU 141 then records the result of inspection (step S4) and outputs the recorded inspection result (step S5). At step S4, the inspection result is recorded in the memory 142. The recorded inspection result can appropriately be read out as, for example, a maintenance. Moreover, at step S5, the output of the inspection result is performed by, for example, outputting a predetermined command to the output part 16. Based on the input command, the output part 16 executes the output by, for example, displaying caution, lighting various LEDs and ringing alarm sound for the user's recognition. It is also possible to execute the output when the result of inspection is abnormal. Accordingly, the processing of abnormality inspection for the communication device 14 is executed. Furthermore, the result of inspection may also be output, as an abnormality signal, to various other devices and circuits inside and outside the vehicle 1, not only to the output unit 16.

Next, the abnormality inspection performed at step S3 in the processing of abnormality inspection will be described. FIG. 7 is a table illustrating a determination example of an abnormal state of the communication device 14 included in the on-vehicle communication system according to the present application. In the table shown in FIG. 7, the left side in the drawing shows the state of the communication lines 14a and 14b to be inspected, whereas the right side shows the detection result of the potential detected by the ADC circuit 141a. Among different types of abnormalities, the open fault indicates an abnormality such as disconnection of the communication lines 14a and 14b. The supply fault indicates an abnormality such as short-circuiting and the like between the communication lines 14a, 14b and the power supply voltage ($V_{+B}$) line. The ground fault indicates an abnormality such as short-circuiting between the communication lines 14a, 14b and the ground. The ground voltage $V_{GND}$ is set as 0 V.

As illustrated in FIG. 7, when normal, the potential detected by the ADC circuit 141a (ADC circuit input voltage value) is $R3/(R1+R2+R3) \times V_{ref}$. In the case of the open fault, the potential will be zero. In the case of the supply fault, the potential will be $R3/(R2+R3) \times V_{+B}$. In the case of the ground fault, the potential will be zero. Accordingly, the inspection on the presence/absence and the type of abnormality can be inspected based on the detected potential, power supply voltage $V_{+B}$, reference voltage $V_{ref}$, ground voltage $V_{GND}$ as well as the resistance values (R1, R2, R3) of the first resistance R1, second resistance R2 and third resistance R3.

The embodiment described above is a mere disclosure of a part of countless examples of the present application, and may appropriately be designed by considering various factors such as purposes and specifications. For example, the inspection method of the present invention may also be applied to the communication device on the power feeding device side, not on the vehicle side. It can further be applied to various fields, for example, to a system other than the system related to a vehicle.

The invention claimed is:

1. A communication device comprising:
   a first resistance connected between a first reference potential and a midway point of one of a pair of communication lines connected to a coil;
   a second resistance and a third resistance arranged in series between a second reference potential different from the first reference potential and a branch point branching from the other one of the pair of communication lines to the second reference potential; and
   a switch configured to open or close a path between the first resistance and the first reference potential.

2. The communication device according to claim 1, further comprising:
   a detection part that detects a potential between the second resistance and the third resistance when the switch is closed; and
   an inspection part that inspects abnormality based on the potential detected by the detection part, the first reference potential and the second reference potential, as well as resistance values of the first resistance, the second resistance and the third resistance.

3. The communication device according to claim 1, further comprising:
   a fourth resistance connected to the second reference potential from a point between the first resistance and the switch.

4. The communication device according to claim 3, wherein a sum of resistance values of the first resistance and the fourth resistance is approximately equal to a sum of resistance values of the second resistance and the third resistance.

5. The communication device according to claim 3, further comprising:
   a terminal resistance connected to the pair of communication lines, wherein
   a sum of resistance values of the first resistance, the second resistance, the third resistance and the fourth resistance is larger than a resistance value of the terminal resistance.

6. An on-vehicle communication system performing communication with a device outside a vehicle through in-vehicle wiring used to feed electric power to a storage mounted on the vehicle, comprising:
   the communication device according to claim 1, configured to input and output communication signals concerning communication; and
   a superimposition/separation unit that superimposes/separates the communication signals through the in-vehicle wiring, including
      a primary coil connected to the in-vehicle wiring, and
      a secondary coil electromagnetically coupled to the primary coil,
   wherein the coil to which the pair of communication lines are connected is the secondary coil included in the superimposition/separation unit.

7. The on-vehicle communication system according to claim 6, wherein the communication device further including:
   a detection part that detects a potential between the second resistance and the third resistance when the switch is closed; and
   an inspection part that inspects abnormality based on the potential detected by the detection part, the first reference potential and the second reference potential, as well as resistance values of the first resistance, the second resistance and the third resistance.

8. The on-vehicle communication system according to claim 6, wherein the communication device further including:
   a fourth resistance connected to the second reference potential from a point between the first resistance and the switch.

9. The on-vehicle communication system according to claim 8, wherein a sum of resistance values of the first resistance and the fourth resistance is approximately equal to a sum of resistance values of the second resistance and the third resistance.

10. The on-vehicle communication system according to claim 6, wherein the communication device further including:
    a terminal resistance connected to the pair of communication lines, wherein
    a sum of resistance values of the first resistance, the second resistance, the third resistance and the fourth resistance is larger than a resistance value of the terminal resistance.

11. An inspection method for inspecting abnormality in a pair of communication lines connectable to a coil in a communication device, comprising:
    detecting a potential between the second resistance and the third resistance when the switch is closed in the communication device according to claim 1;
    inspecting abnormality based on the detected potential, the reference potentials, and resistance values of the first resistance, the second resistance and the third resistance; and
    recording and/or outputting a result of inspection.

* * * * *